United States Patent [19]

Harada

[11] 4,381,517
[45] Apr. 26, 1983

[54] SOLID STATE IMAGE SENSOR

[75] Inventor: Nozomu Harada, Yokohama, Japan

[73] Assignee: Tokyo Shibaura Denki Kabushiki Kaisha, Kawasaki, Japan

[21] Appl. No.: 215,660

[22] Filed: Dec. 12, 1980

[30] Foreign Application Priority Data

Dec. 21, 1979 [JP] Japan ............... 54/165506

[51] Int. Cl.³ .................................. H01L 27/14
[52] U.S. Cl. ............................ 357/30; 357/23; 357/16; 357/31
[58] Field of Search .................. 357/30, 31, 16, 23

[56] References Cited

U.S. PATENT DOCUMENTS 4,323,912  4/1982  Koike et al. ................ 357/31

OTHER PUBLICATIONS

Yasuaki Terui et al., ISSCC 80, Digest Paper WAM2.6, pp. 34-35, 1980.

Primary Examiner—M. Edlow
Attorney, Agent, or Firm—Oblon, Fisher, Spivak, McClelland & Maier

[57] ABSTRACT

A MOSFET consisting of a source region, a drain region and a gate layer is formed on a p-type semiconductor substrate. Field insulation layers are formed to surround the MOSFET, and conductive electrodes are formed thereover. A photosensing layer is overlayed on this structure. This photosensing layer is made of an amorphous chalcogen glass semiconductor material, for example Se-As-Te, and is in contact with the source region through an opening. A charge packet generated within the photosensing layer is transferred to the source region by an electric field induced when a voltage is applied to the conductive electrodes.

12 Claims, 3 Drawing Figures

SOLID STATE IMAGE SENSOR

The present invention relates to a solid state image sensor and, more particularly, to an improved solid state image sensor having a wide dynamic range.

With a solid state image sensor having a photosensitive part and a readout part for reading out the signal charge (charge packet) stored at the photosensitive part, it is generally necessary to maximize the allowable value of the charge packet at the photosensitive part and the readout part for widening the dynamic range. For example, when a strong spotlight is incident on the photosensitive part, excessive charge packet is generated at the photosensitive part. Part of the excessive charge packet flows out from the potential well of the photosensitive part and is mixed into the adjacent potential well. This causes an undesirable phenomenon called "blooming" i.e., generation of distortion in the image signal. Since the maximum allowable value of the charge packet at the photosensitive part may be increased by suppressing this blooming phenomenon, the dynamic range of the solid state image sensor may then be widened.

In a conventional solid state image sensor designed to prevent blooming, first and second regions are formed on the upper surface of a p-type semiconductor substrate close to each other by implanting or diffusing into the substrate an n-type impurity to form a high conductivity n+-type region. A gate layer is formed on the surface of the substrate surrounded by the first and second regions so as to be separate from these regions. The gate layer and the first and second regions constitute a metal-oxide-semiconductor field effect transistor (to be referred to as a MOSFET for brevity hereinafter). Thus, the first region corresponds to the source, and the second region corresponds to the drain of the MOSFET. A field insulation layer is formed which surrounds the MOSFET on the substrate. A metal layer (to be referred to as a source electrode hereinafter) connected to the first region (to be referred to as a source region) is formed insulated from the second region (to be referred to as a drain region) and the gate layer. Part of the source electrode is formed on the field insulation layer, and the rest of it extends above the MOSFET. A photosensing layer is formed on the field insulation layer and the source electrode. A transparent electrode is overlayed on the photosensing layer. The photosensing layer is formed of a chalcogenide glass semiconductor such as selenium-arsenic-tellurium (to be represented as Se-As-Te hereinafter). A voltage of predetermined level is applied to the transparent electrode.

When incident light passes through the transparent electrode and is directed into the photosensing layer, a charge packet corresponding to the incident light is generated in the photosensing layer. This charge packet is transferred towards the source electrode by the electric field induced by the voltage applied across the transparent electrode. The charge packet accumulated by the source electrode thereafter accumulates at the source of the MOSFET. When a voltage is applied to the gate under this condition, the MOSFET is turned on and the charge packet is transferred to the drain.

With a conventional solid state image sensor of such a construction, most of the incident light passing through the transparent electrode is photoelectrically transduced within the photosensing layer so that the incident light does not enter the substrate for the most part. Due to this, the amount of the charge packet generated in the substrate becomes extremely small, so that blooming generated by excessive charge in the substrate may be prevented. However, a voltage of high level (e.g., 40 V) is applied to the transparent electrode for transferring the charge packet generated in the photosensing layer to the source region. Thus, since a high electric field (e.g., about $10^6$ V/cm) is generated within the photosensing layer, the presence of pinholes, if any, causes local dielectric breakdown of the photosensing layer so that the transparent electrode and the source electrode connected to the source region are electrically short-circuited. This shortcircuit renders the image sensor instable to operate. Although it is possible to reduce by various techniques the number of the pinholes present in the photosensing layer, it is extremely difficult to eliminate all pinholes. Even when the number of pinholes is reduced to a small number by a special technique, pinholes are formed with time so that it becomes more difficult to maintain the amorphous semiconductor layer, in this case chalcogenide glass semiconductor layer, with no pinholes.

It is, therefore, the primary object of the present invention to provide a solid state image sensor which is capable of operating with good efficiency without being damaged by pinholes within a photosensing layer.

According to the present invention, in a semiconductor substrate of one conductivity type is formed active region of opposite conductivity type. A field insulation layer is formed to surround the active region and a photosensing layer is formed thereover. A charge transfer means is formed in the photosensing layer for transferring the charge packet generated in the photosensing layer to the active region.

This invention can be more fully understood from the following detailed description when taken in conjunction with the accompanying drawings, in which.

Figure 1:
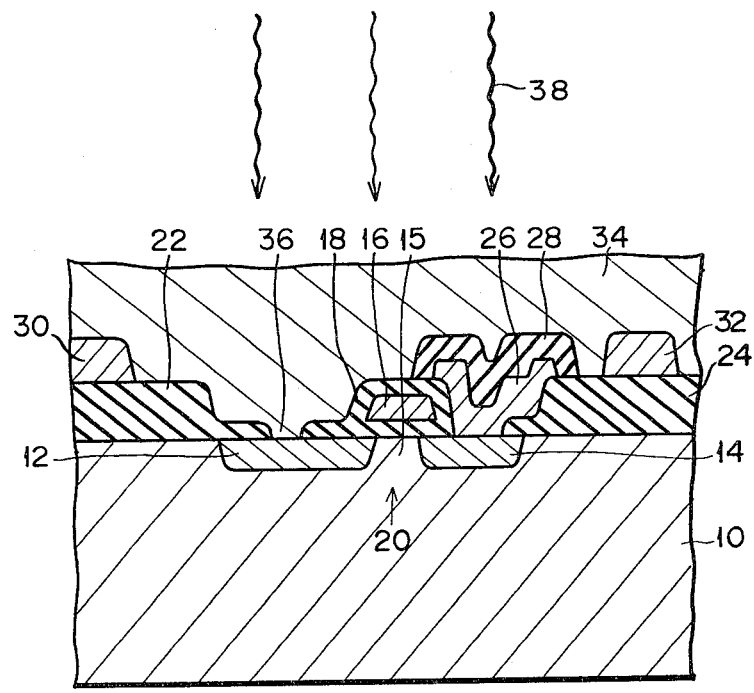
FIG. 1 is a sectional view of a solid state image sensor embodying this invention.

According to one embodiment of the present invention shown in FIG. 1, on the surface of a semiconductor substrate 10 of one conductivity type (e.g., p-type) are formed first and second regions 12 and 14 of opposite conductivity type (e.g., n-type). The regions 12 and 14 are formed by implanting or diffusing into the substrate 10 an n-type impurity to form high conductivity n+-type regions. A metal layer 16 is formed above a region 15 at the part of the surface of the substrate 10 between the first and second regions 12 and 14. This metal layer is made of aluminum, for example, and is insulated from the first and second regions 12 and 14 by an insulation layer 18. The first and second regions 12 and 14 and the metal layer 16 constitute a metal-oxide semiconductor field-effect transistor 20 (to be referred to as a MOSFET for brevity hereinafter). The first and second regions 12 and 14 correspond to the source region and the drain region of the MOSFET, and the metal layer 16 corresponds to the gate layer. Field insulation layers 22 and 24 are formed to a predetermined thickness (e.g., 1 μm) on the substrate 10 around the MOSFET 20. The insulation layer 18 also covers the metal layer 16 (to be referred to as the gate layer hereinafter). A conductive layer 26 is formed on the second region 14 (to be referred to as the drain region hereinafter) to be in contact with part of the insulation layer 18 and with the field insulation layer 24, and an insulation layer 28 is formed thereover. On the field insulation layers 22 and 24 are formed conductive electrodes 30 and 32 of, for example, an metal material such as aluminum (to be referred to as Al electrodes). Finally, a photosensing layer 34 is formed to a predetermined thickness (e.g., 4 μm) on the MOSFET 20, the field insulation layers 22 and 24, and the Al electrodes 30 and 32. The photosensing layer 34 is made of an amorphous chalcogenide semiconductor, for example Se-As-Te, and is electrically connected to the source region 12 through an opening 36.

The mode of operation of the solid state image sensor of the above construction will now be described. Incident light 38 directly enters the photosensing layer 34. The incident light entered is photoelectrically transduced within the photosensing layer 34 so that a charge packet is produced in an amount proportional to the quantity of incident light. The charge packet is transferred towards the source region 12 by an electric field generated between the source region 12 and the Al electrodes 30 and 32 by a voltage applied to the Al electrodes 30 and 32. For example, when a charge packet is generated in the photosensing layer 34 and above the insulation layer 28, the charge packet is first transferred towards the source layer 12 parallel to the surface of the substrate 10 according to the electric field induced between the Al electrodes 30 and 32 and the source region 12. Thereafter, the charge packet is accumulated in the source region 12 through the opening 36. When a positive voltage is applied to the gate layer 16, an n-type channel is formed at the surface of the substrate 10 immediately below the gate layer 16. As a result, the charge packet accumulated within the source region 12 of $n^{30}$-type is transferred through the channel to the drain region 14 as a readout part and is thereafter read out through the conductive layer 26.

With a solid state image sensor of the construction shown in FIG. 1, the electric field within the photosensing layer 34 is generated in a direction substantially parallel to the surface of the substrate 10. Accordingly, even when pinholes are present within the photosensing layer 34, no pinhole serves as a current path so that electrical short-circuiting between the Al electrode 32 and the source region 12 tends to occur less frequently. One conventional defect is that excess current may flow between the Al electrode 32 and the source region 12 through pinholes present in the photosensing layer 34, and other pinholes are formed by heat generated by this excess current. This conventional defect is eliminated. Consequently, the reliability of the solid state image sensor is improved. Further, since the transparent electrode formed on the photosensing layer 34 is unnecessary, the incident light 38 directly enters the sensing layer 34. Since there is no transmission loss by the transparent electrode, the S/N ratio and the sensitivity of the image sensor are improved. Further, technical problems generally encountered in the process of forming the transparent electrode may be eliminated, such as difficulties in forming the layer of a material having good transmittance, and difficulties involved in the formation of a uniform layer in an atmosphere at a relatively low temperature (e.g., less than 120° C.) for preventing degradation of the layer quality.

Figure 2:
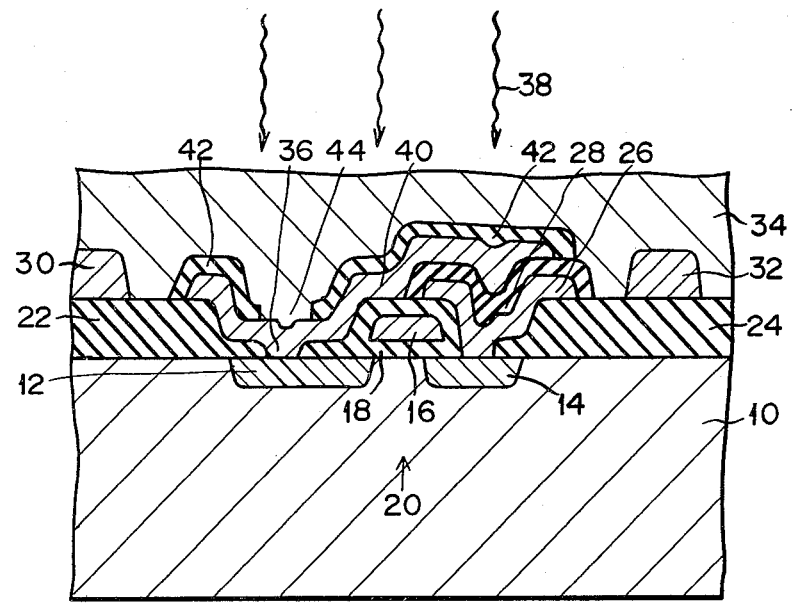
FIG. 2 is a sectional view of a solid state image sensor according to another embodiment of this invention.

According to another embodiment of the present invention shown in FIG. 2, a conductive layer 40 electrically connected to the source region 12 of the MOSFET 20 is formed above the MOSFET 20. Part of the conductive layer 40 is formed on the field insulation layer 22, another part of the conductive layer 40 is formed in contact with the source region 12 through the opening 36, and the rest of it is formed on the insulation layers 18 and 28. This conductive layer 40 (to be referred to as the source electrode hereinafter) is made of, for example, aluminum. An insulation layer 42 having an opening 44 is formed on the source electrode 40, and the photosensing layer 34 is overlayed thereover. The photosensing layer 34 is preferably in contact with the source electrode 40 through the opening 44 arranged above the source region 12. The other elements such as the Al electrodes 30 and 32, are the same as in the embodiment described with reference to FIG. 1, so that their description will be omitted.

According to another embodiment of the present invention, the source electrode 40 is formed which is connected to the source region 12, and the insulation layer 42 is formed on the source electrode 40. Thus, even when the incident light 38 is not completely photoelectrically transduced within the photosensing layer 34, the unaffected light may be prevented from entering the substrate 10 by the source electrode 40. Thus, the generation of blooming within the substrate 10 may be prevented with more certainty. Further, since it is not necessary to completely perform the photoelectrical transducing operation within the amorphous semiconductor layer, material which is slightly inferior in photoelectrical transducing efficiency and transition absorption coefficient may be used. Thus, suitable amorphous semiconductor materials may be selected from a wider range, so that the manufacturing cost may be decreased.

Figure 3:
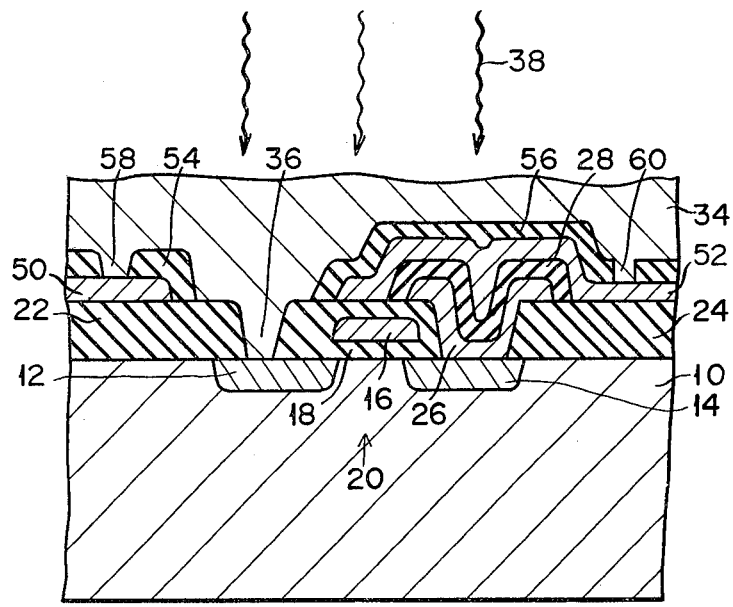
FIG. 3 is a sectional view of a solid state image sensor according to still another embodiment of this invention.

According to still another embodiment shown in FIG. 3, Al electrodes 50 and 52 are formed over a relatively wide area (as compared with the corresponding part of the embodiments shown in FIGS. 1 and 2) on the field insulation layers 22 and 24 formed around the MOSFET 20. The Al electrode 52 is formed to extend on the insulation layers 18 and 28 and the field insulation layer 24, and covers over the drain region 14 and the gate layer 16 of the MOSFET 20. Insulation layers 54 and 56 are formed on the Al electrodes 50 and 52, respectively. These insulation layers 54 and 56 have openings 58 and 60, respectively. The photosensing layer 34 is overlayed on such a structure. The photosensing layer 34 is in contact with the source region 12 through the openings 34 and is also in contact with the Al electrodes 50 and 52 through the openings 58 and 60, respectively. Since the other elements such as the MOSFET 20 of this embodiment are the same as in the embodiment shown in FIG. 1, the description thereof will be omitted.

According to this embodiment of the above construction, the Al electrode 52 formed on the field insulation layer 24 has a large surface area and is formed to substantially cover the entire surface of the MOSFET 20. Thus, the incident light 38 is prevented from entering the substrate 10 by the Al electrode 52. Since the Al electrode 50 formed on the field insulation layer 22 and the Al electrode 52 formed on the insulation layers 18, 28 and 24 are close to the source region 12, the electric field near the source region 12 becomes strong. The charge packet generated in correspondence with the incident light 38 is prevented from staying in the vicinity of the opening 36. Even when pinholes are present near the opening 36, the Al electrodes and the source layer are not electrically short-circuited since the Al electrodes are covered with the insulation layers.

Although the present invention has been shown and described with respect to particular embodiments, various changes and modifications which are obvious to a person skilled in the art to which the invention pertains are deemed to lie within the spirit, scope, and contemplation of the invention. For example, the embodiment shown in FIGS. 1 to 3 was disclosed based on a MOS type solid state image sensor. However, the present invention is similarly applicable to an interline type solid state image sensor comprising charge coupled devices. Although a p-type substrate was used in the embodiment shown in FIGS. 1 to 3, it is to be understood that an n-type substrate may be used instead. Further, in place of the amorphous semiconductor material used for the photosensing layer, a single crystalline semiconductor material and/or a polycrystalline semiconductor material may be used. In addition, when the source electrode is formed on the source region 12 according to the embodiment shown in FIG. 2, and an insulation layer having an opening is formed thereover in the embodiment shown in FIG. 3, the reliability of the image sensor may be further improved. The position of the opening 44 of the insulation layer 42 of the embodiment shown in FIG. 2 need not be immediately above the source region 12.

What is claimed is:

1. A solid state image sensor comprising:
    a semiconductor substrate of a first conductivity type having a surface portion;
    an active region of a second conductivity type opposite to said first conductivity type and formed at the surface portion of said substrate;
    field insulation layers formed on said substrate and surrounding said active region;
    a photosensing layer of a semiconductor material formed on said substrate and said insulation layers and generating a charge packet corresponding to the incident light; and
    charge transfer means for generating within said photosensing layer an electric field having substantial components extending substantially parallel to the surface of said substrate to transfer the charge packet generated by the incident light within said photosensing layer toward said active region, said charge transfer means including electrode means formed in said photosensing layer and made of conductive material for receiving a bias potential applied thereto and for generating said electric field between said active region and said electrode means.

2. A solid state image sensor according to claim 1, wherein said electrode means are provided on said field insulation layer, and said photosensing layer surrounds at least said electrode means.

3. A solid state image sensor according to claim 2, wherein said electrode means are made of metallic material.

4. A solid state image sensor according to claim 2, further comprising a metal layer formed spaced part from said active region, said active region comprising a first region of said second conductivity type and a second region of said second conductivity type formed in the vicinity of said first region; and said first region, said second region and said metal layer constituting a metal-oxide-semiconductor field-effect transistor.

5. A solid state image sensor according to claim 4, wherein said first region, said second region, and said metal layer correspond to a source region, a drain region and a gate layer, respectively.

6. A solid state image sensor according to claim 2, wherein said photosensing layer is formed of an amorphous semiconductor material.

7. A solid state image sensor according to claim 2, further comprising a conductive layer electrically connected to said active region and formed on said field insulation layers and said active region of said substrate, and an insulation layer formed on said conductive layer and having an opening, said active region being electrically connected to said photosensing layer through said opening.

8. A solid state image sensor according to claim 7, wherein said conductive layer is formed to cover at least said active region.

9. A solid state image sensor according to claim 2, wherein insulation layers having openings are formed to cover said conductive electrodes, and said conductive electrodes are electrically connected to said photosensing layer through said openings.

10. A solid state image sensor according to claim 4, 5 or 8, wherein said conductive electrodes are formed to extend at least over said metal layer and said second region of said metal-oxide-semiconductor field-effect transistor.

11. A solid state image sensor according to claim 2, wherein said first conductivity type of said substrate is p-type, and said second conductivity type of said active region is n-type.

12. A solid state image sensor according to claim 2, wherein said conductive electrodes are formed of aluminum.

* * * * *